United States Patent
Li

(10) Patent No.: US 7,430,122 B2
(45) Date of Patent: Sep. 30, 2008

(54) ELECTRONIC DEVICE ASSEMBLY WITH CLIPS FOR MOUNTING A HEAT SINK THEREON

(75) Inventor: Dong-Yun Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/682,271

(22) Filed: Mar. 5, 2007

(65) Prior Publication Data

US 2008/0062653 A1 Mar. 13, 2008

(30) Foreign Application Priority Data

Sep. 8, 2006 (CN) .................... 2006 1 0062512

(51) Int. Cl.
*H05K 7/20* (2006.01)
*H01L 23/36* (2006.01)

(52) U.S. Cl. ............. 361/719; 361/695; 361/704; 361/709; 165/80.3; 165/104.33; 165/104.34; 165/185; 257/718; 257/719; 411/41; 411/45

(58) Field of Classification Search ............. 361/687, 361/690–697, 702–712, 715–717, 719–721, 361/736, 752; 165/80.3, 80.4, 104.33, 104.34, 165/121–122, 185; 174/16.3, 252; 257/706–727; 24/293–296, 453, 458, 510, 511; 411/41, 411/45, 297, 508, 509, 511, 518, 521, 913

See application file for complete search history.

(56) References Cited

U.S. PATENT DOCUMENTS

| | | | |
|---|---|---|---|
| 6,282,091 B1 * | 8/2001 | Horng | 361/697 |
| 6,392,889 B1 * | 5/2002 | Lee et al. | 361/704 |
| 6,497,273 B1 * | 12/2002 | Horng et al. | 165/80.3 |
| 6,498,724 B1 * | 12/2002 | Chien | 361/687 |
| 6,654,246 B2 | 11/2003 | Wu | |
| 6,795,317 B1 * | 9/2004 | Liu | 361/704 |
| 6,866,540 B2 * | 3/2005 | Robertson | 439/488 |
| 6,934,155 B2 * | 8/2005 | Aoki et al. | 361/704 |
| 7,099,156 B2 * | 8/2006 | Chen et al. | 361/719 |
| 7,116,556 B2 * | 10/2006 | Lee et al. | 361/704 |
| 7,126,823 B2 * | 10/2006 | Chen et al. | 361/702 |
| 7,168,808 B2 * | 1/2007 | Perlin et al. | 353/7 |
| 7,180,743 B2 * | 2/2007 | Chen et al. | 361/704 |
| 7,359,200 B2 * | 4/2008 | Zhou et al. | 361/704 |

\* cited by examiner

*Primary Examiner*—Michael V Datskovskiy
(74) *Attorney, Agent, or Firm*—Frank R. Niranjan

(57) ABSTRACT

An electronic device assembly includes a PCB (10), a heat sink (30) mounted on the PCB, a back plate (20) attached below the PCB, a fan holder (40) mounted on a top of the heat sink and a fan mounted on the fan holder. The fan holder has a plurality of sleeves (46). A plurality of clips (50) is assembled on the fan holder. Each clip includes a locking column (52) received in a corresponding sleeve of the fan holder, a shank (56) extending through the column, a spring (54) mounted around the column and sandwiched between a top of the column and a bottom of the shank, and an operating member (58) pivotably connected to the shank. The back plate forms a plurality of studs snappingly engaging with the locking columns to securely mount the heat sink on the PCB.

16 Claims, 8 Drawing Sheets

ELECTRONIC DEVICE ASSEMBLY WITH CLIPS FOR MOUNTING A HEAT SINK THEREON

BACKGROUND OF THE INVENTION

1. Field of the Invention

The present invention relates to an electronic device assembly, and particularly to an electronic device with clips for attachment of a heat sink.

2. Description of Related Art

It is well known that, during operation, computer electronic devices such as central processing units (CPUs) can generate large amounts of heat. The heat must be removed from the electronic device to prevent it from becoming unstable or being damaged. Typically, a heat sink is attached to an outer surface of the electronic device to absorb heat from the electronic device, and the heat absorbed by the heat sink is then dissipated into the ambient air.

In order to improve the efficiency of a heat sink a fan is used to force air through the heat sink. Usually, the fan comprises a frame having upper and lower retaining flanges extending outwards from two opposite ends of each corner thereof, and is mounted to the heat sink via a fan holder. Conventionally, the heat sink mainly comprises a heat-conducting base for contacting a heat generating electronic device and a plurality of heat dissipating fins extending from a top surface of the base. Typically, the fan is secured on the fan holder by a plurality of elongated screws, which each has a head and a shaft extending axially from the head. The fan defines a fixing hole in a retaining flange corresponding to the screw. To attach the fan to the heat sink, the shafts of screws extend through the fixing holes of the fan to engage with the fan holder, whilst the heads of the screws rest on the upper retaining flanges. In this way, the fan is firmly sandwiched between the heads of the screws and the fan holder. U.S. Pat. No. 6,654,246 shows an example of a heat sink attached with a fan which is secured to the heat sink through a fan holder and a plurality of elongated screws in a manner as mentioned above. However, assembly and disassembly of the heat sink and the fan is awkward and time consuming.

SUMMARY OF THE INVENTION

An electronic device assembly in accordance with a preferred embodiment of the present invention comprises a printed circuit board (PCB), a heat sink mounted on the PCB, a back plate attached below the PCB, a fan holder mounted on a top of the heat sink and a fan mounted on the fan holder. The fan holder has a plurality of sleeves. A plurality of clips is assembled on the fan holder. Each of the clips includes a locking column received in a corresponding sleeve of the fan holder, a shank extending through the column, a spring mounted around the column and sandwiched between a top of the column and a bottom of the shank, and an operating member pivotably connected to the shank. The back plate forms a plurality of studs engaging with the locking columns. When the operating members are rotated from a vertical orientation to a horizontal orientation, the shanks are lifted a distance to compress the springs, whereby the locking columns and accordingly the studs are moved upwardly, and the heat sink, the back plate and the printed circuit board are securely connected together.

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
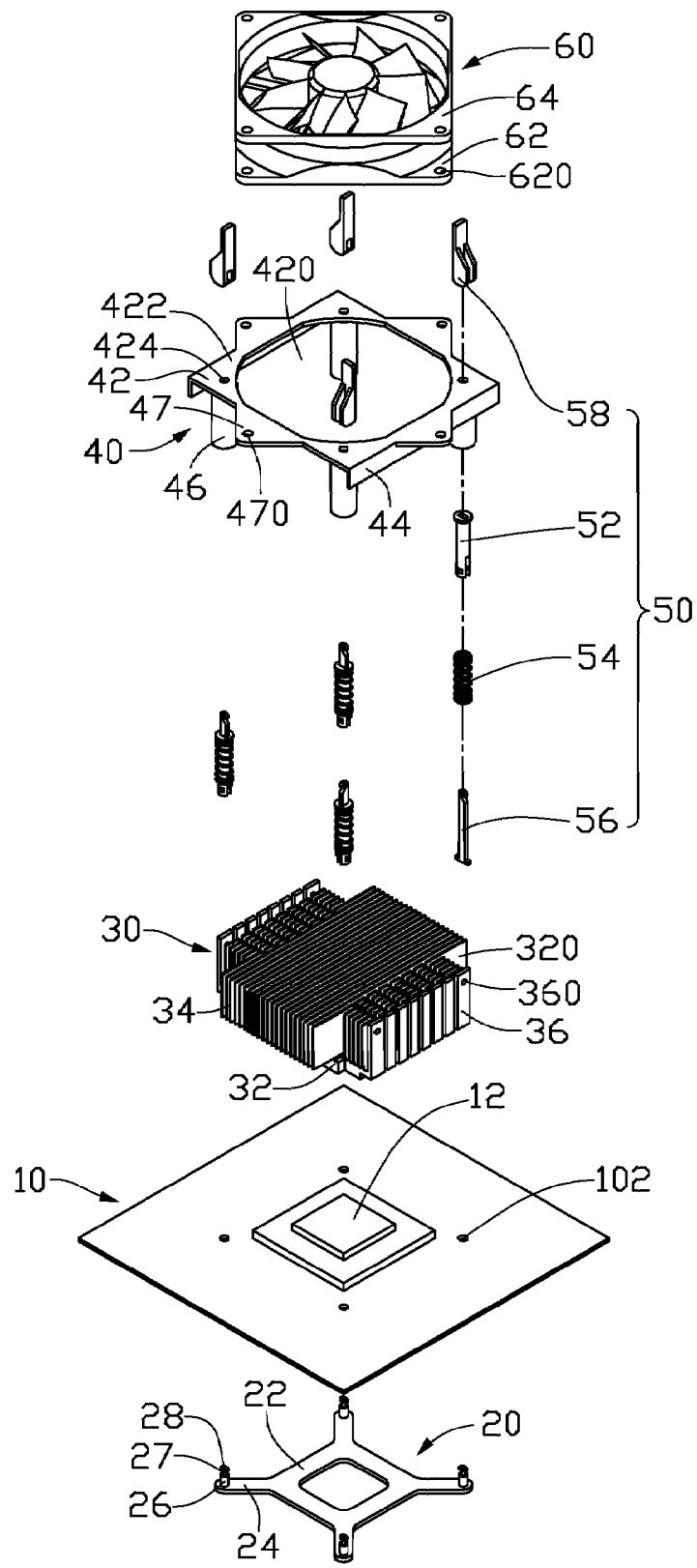
FIG. 1 is an exploded, isometric view of an electronic device assembly in accordance with a preferred embodiment of the present invention.

FIG. 1 illustrates an exploded view of an electronic device assembly in accordance with a preferred embodiment of the present invention. The electronic device assembly comprises a printed circuit board 10 having an electronic component, such as a CPU 12 mounted thereon, a heat dissipation device 100 (labeled in FIG. 3) mounted on the printed circuit board 10 to dissipate heat generated by the CPU 12 and a back plate 20 mounted below the printed circuit board 10.

The heat dissipation device 100 comprises a heat sink 30, a fan 60, a fan holder 40 for mounting the fan 60 on the heat sink 30, four clips 50 (see FIG. 2 for further details) cooperating with the fan holder 40 and the back plate 20 for securing the heat sink 30 on the CPU 12.

The heat sink 30 is made from a good heat conductive material, such as aluminum, and comprises a base 32 and a plurality of parallel fins 34, 36 perpendicularly and upwardly extending from the base 32. The base 32 has a bottom face for contacting the CPU 12. The fins 36 are of shorter length than the fins 34 and are located at central portions of opposite lateral sides of the fins 34 such that four receiving spaces 320 are formed at four corners of the heat sink 30. Two opposite outmost fins 36 each define a pair of threaded holes 360 therein for providing passages of screws (not shown) to mount the fan holder 40 on the heat sink 30.

The fan holder 40 comprises a square flat body 42 and a pair of sidewalls 44 extending vertically and downwardly from two opposite lateral sides of the body 42. The two sidewalls 44 are used for engaging with the two outmost fins 36. Four screws (not shown) extend through the sidewalls 44 and the two outmost fins 36 to be engaged in the threaded holes 360 of the outmost fins 36 to mount the fan holder 40 on the heat sink 30. An opening 420 is defined at a center of the body 42 for providing a passage of an airflow generated by the fan 60 in such a manner that four corners 422 are formed and surround the opening 420. A triangular mounting plate 47 extends horizontally from a central portion of each side of the body 42. A threaded hole 470 is defined in each mounting plate 47 for providing a passage of a corresponding screw (not shown) to mount the fan 60 onto the fan holder 40. A hollow cylindrical sleeve 46 extends downwardly from a bottom surface of each corner 422 and is received in the corresponding receiving space 320 of the heat sink 30 and provides a passage of the corresponding clip 50. A through hole 424 is defined in each corner 422 of the body 42 and communicates with the sleeve 46. The through hole 424 has an inner diameter smaller than that of the sleeve 46.

Figure 2:
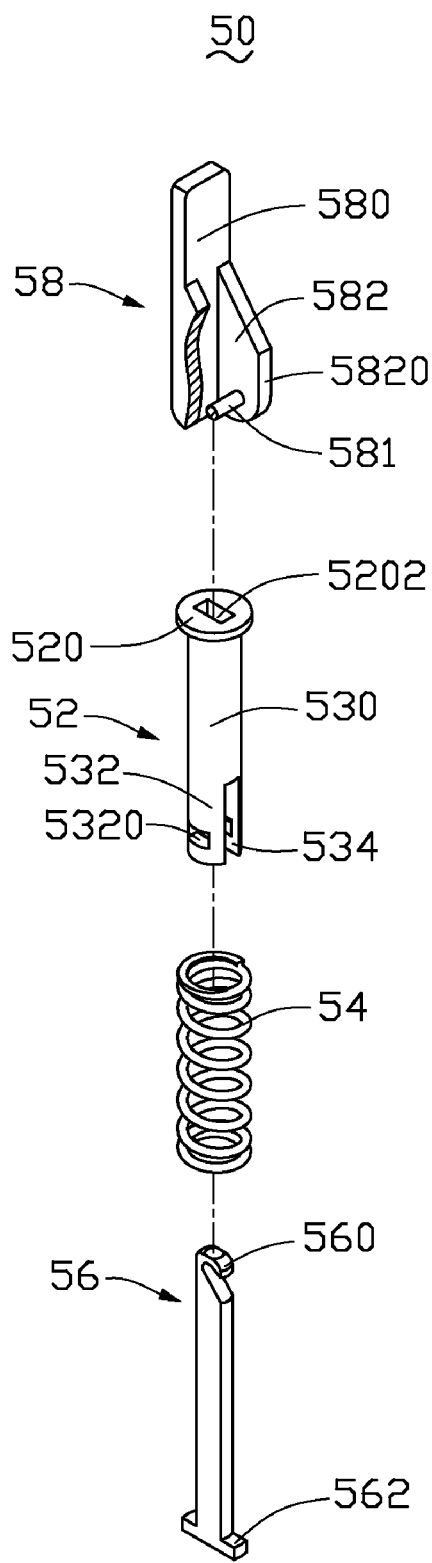
FIG. 2 is an exploded, isometric view of a clip from FIG. 1, wherein an operating member of the clip has a part being removed to clearly show an inner structure thereof.

Referring also to FIG. 2, each clip 50 comprises a locking column 52 received in the sleeve 46 of the fan holder 40, a spring 54 loosely fitting around the locking column 52, a shank 56 extending through the locking column 52 and an operating member 58 located above the body 42 of the fan holder 40 and pivotably connected with a top of the shank 56.

The locking column 52 has a circular pedestal 520 at a top thereof and a cylindrical shaft 530 extending downwardly from the pedestal 520. The pedestal 520 has an outer diameter smaller than the inner diameter of the sleeve 46 of the fan holder 40 and larger than the inner diameter of the through hole 424 defined in the body 42 of the fan holder 40 in a manner such that the locking column 52 is capable of being received in the sleeve 46 of the fan holder 40. The shaft 530 of the locking column 52 is bifurcated at a lower portion thereof in a manner such that a pair of spaced and symmetrical locking arms 532 are formed. A channel 534 is defined between the locking arms 532 and located at a central portion of the shaft 530. Each locking arm 532 defines a groove 5320 therein adjacent to a bottom thereof. A rectangular slot 5202 is defined through the pedestal 520 and the shaft 530. The rectangular slot 5202 terminates at the channel 534.

The shank 56 is an elongated flat plate and used to extend through the slot 5202 of the locking column 52. A catch 560 is formed at the top of the shank 56 for engaging with the operating member 58 of the clip 50. A bar 562 is formed on a bottom of the shank 56 for supporting the spring 54 thereon. The bar 562 extends horizontally and orients to the channel 534 of the locking column 52. An extending length of the bar 562 is larger than an outer diameter of the shaft 530 of the locking column 52 in a manner such that the shank 56 extends through the slot 5202 of the locking column 52 along a bottom-to-top direction until the bar 562 abuts against the shaft 530 at the channel 534.

The operating member 58 comprises a plane handle 580 and a pair of spaced engaging bodies 582 extending perpendicularly from two opposite lateral sides of the handle 580. A pivot 581 is adjacent to an end of the engaging bodies 582 and mounted between the two engaging bodies 582 for engaging with the catch 560 of the shank 56. A retaining face 5820 is formed at an outer face of each engaging body 582. A perpendicular distance between the retaining face 5820 and the pivot 581 is not equal to but larger than that between a bottom surface of the engaging body 582 and the pivot 581.

Referring to FIG. 1 again, the fan 60 has lower and upper flanges 62, 64 extending outwards and horizontally at each corner thereof. The lower flanges 62 define mounting holes 620 therein. The mounting holes 620 of the fan 60 are oriented to be in alignment with the threaded holes 470 of the mounting plate 47 of the fan holder 40 when the fan 60 is brought to be mounted to the fan holder 40 on the heat sink 30.

The back plate 20 is attached below the printed circuit board 10, for supporting the printed circuit board 10. The back plate 20 comprises a square base 22 defining an opening (not labeled) therein and four legs 24 extending horizontally from four corners of the base 22. A pole 26 is formed upwardly at a free end of each leg 24 for extending through a corresponding hole 102 defined in the printed circuit board 10. A T-shaped stud (not labeled) is formed on each pole 26. The T-shaped stud comprises a stop portion 28 at a top thereof for engaging with the locking arm 532 of the locking column 52 and an elongated guiding portion 27 extending downwardly from the stop portion 28.

Figure 3:
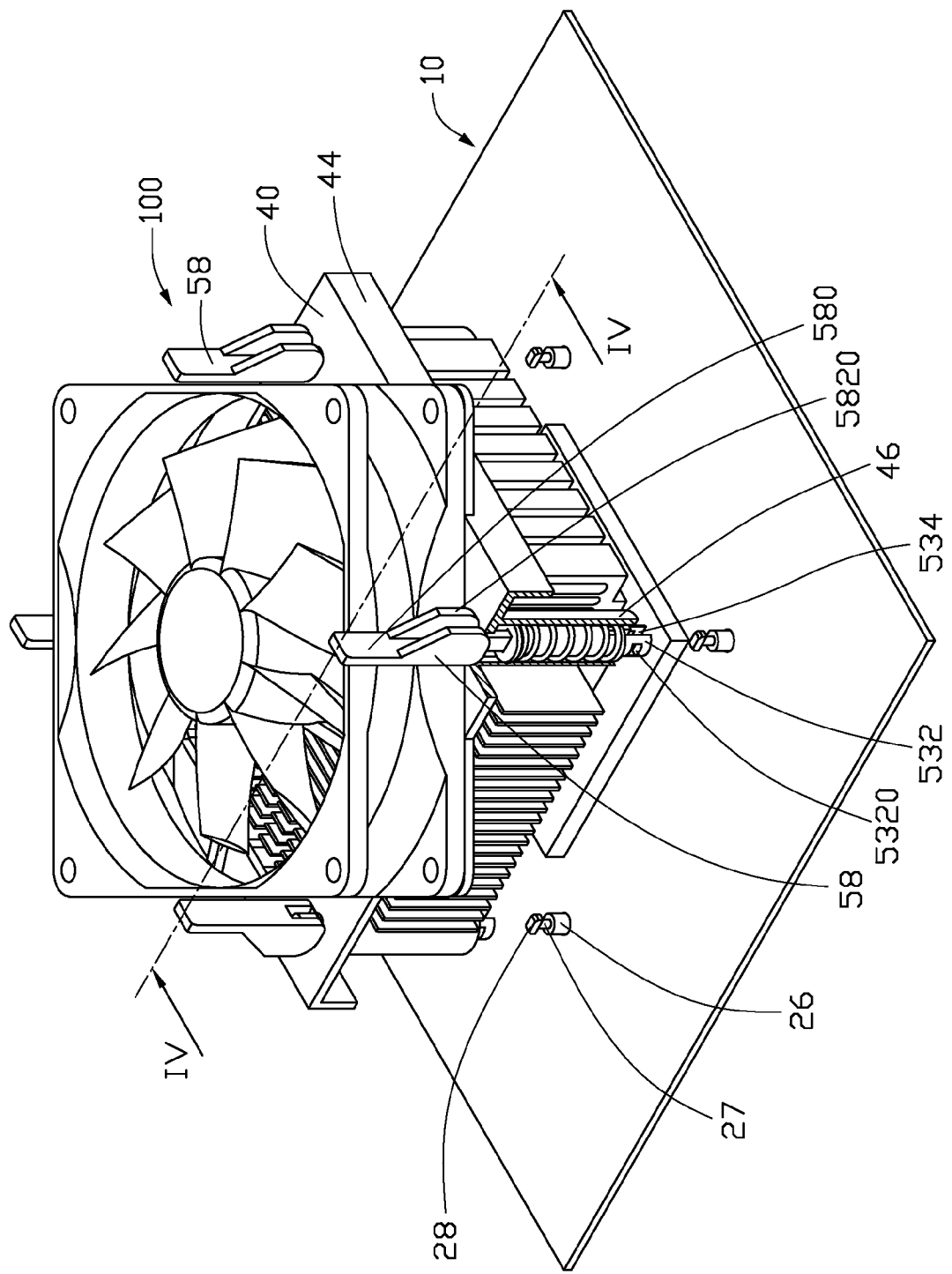
FIG. 3 is a preassembled view of FIG. 1, wherein a fan holder of the electronic device assembly has a part being removed to clearly show an inner structure thereof.

Referring to FIGS. 1-3, in assembly of the fan holder 40 and the clips 50, each spring 54 is mounted around the corresponding shaft 530 of the corresponding locking column 52. The shank 56 is brought to extend through the slot 5202 of the locking column 52 and the catch 560 of the shank 56 is exposed out of the pedestal 520 of the locking column 52 in such a manner that the spring 54 is compressed between the pedestal 520 of the locking column 52 and the bar 562 of the shank 56; simultaneously, the bar 562 is received in the channel 534 of the locking column 52. A combination of the locking column 52 and the shank 56 is brought to extend through the corresponding sleeve 46. The catch 560 is exposed from the through hole 424 of the body 42 of the fan holder 40 to clasp the pivot 581 of the operating member 58. Thus, the clips 50 and the fan holder 40 are assembled together.

Figure 4:
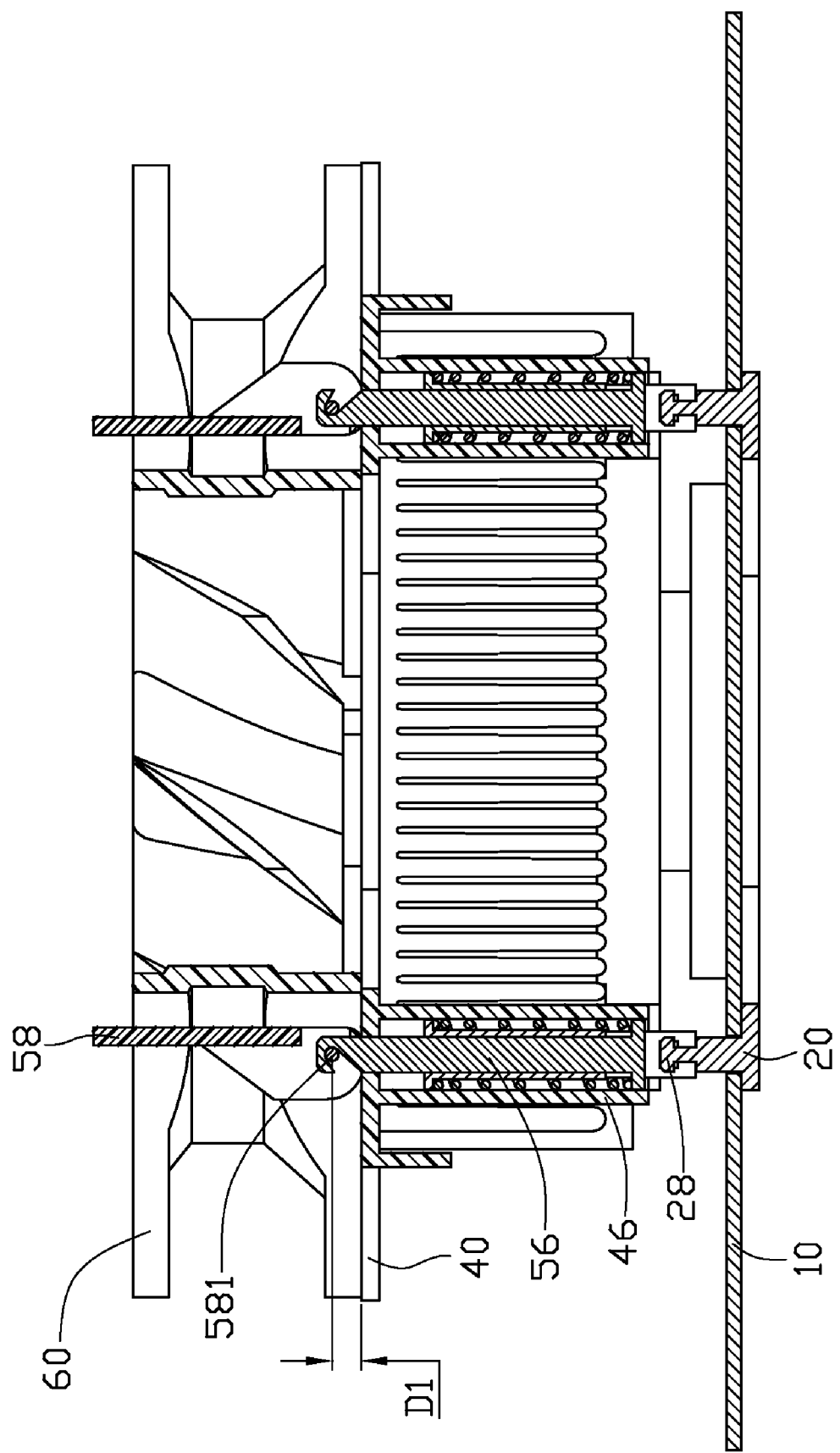
FIG. 4 is an assembled and cross-sectional view taken along line IV-IV of FIG. 3 with the clip in an opened position.

Referring to FIGS. 3-4, in an assembly of the electronic device, the back plate 20 is attached below the printed circuit board 10 with the pole 26 extending through the hole 102 of the printed circuit board 10 and the T-shaped stud of the back plate 20 is exposed out of the hole 102. After the heat dissipation device 100 is assembled, the heat dissipation device 100 is mounted on the printed circuit board 10 and the bottom surface of the heat sink 30 contacts with the CPU 12 mounted on the printed circuit board 10; simultaneously, the T-shaped stud of the back plate 20 is brought to extend through the channel 534 of the locking column 52 and in alignment with the groove 5320 of the locking arm 532 of the locking column 52. In this original position, the operating member 58 is positioned in an opened position. The handle 580 of the operating member 58 is upright and parallel to the sidewall 44 of the fan holder 40, and there is a distance D1 between the pivot 581 and a top surface of the fan holder 40. The retaining face 5820 of the operating member 58 is perpendicular to the top surface of the fan holder 40.

Figure 5:
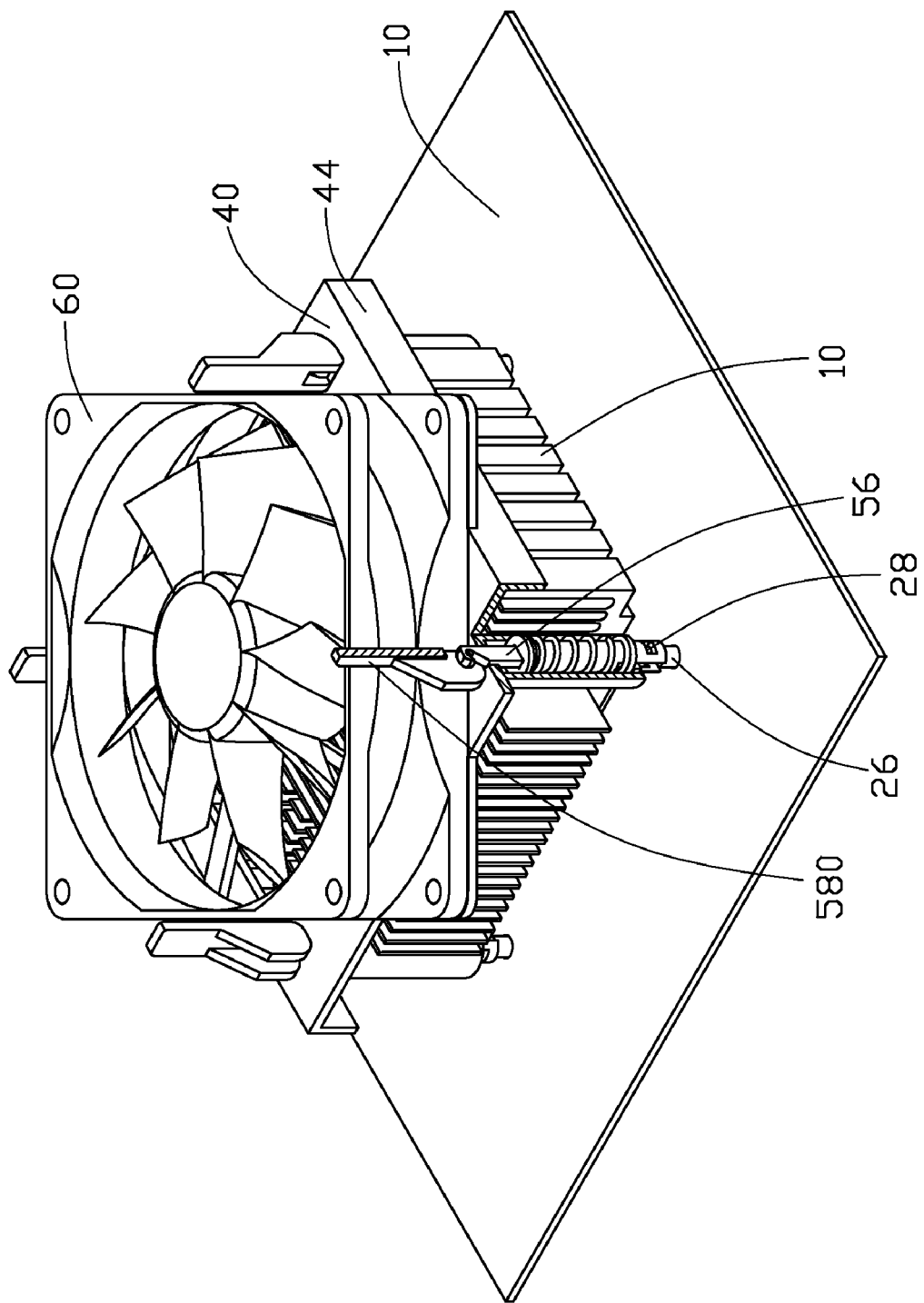
FIG. 5 is an assembled view of FIG. 3, wherein the operating member of the clip is rotated 90 degrees in the opened position.

Referring to FIGS. 3 and 5, the operating member 58 is rotated about 90 degrees about a vertical axis of the sleeve 46 of the fan holder 40. The shank 56 and the locking column 52 are driven to be rotated about the vertical axis of the sleeve 46 in a manner such that the stop portion 28 of the back plate 20 is engaged in the groove 5320 of the locking arm 532 of the locking column 52. In this position, the handle 580 of the operating member 58 is still perpendicular to the top surface of the fan holder 40.

Figure 6:
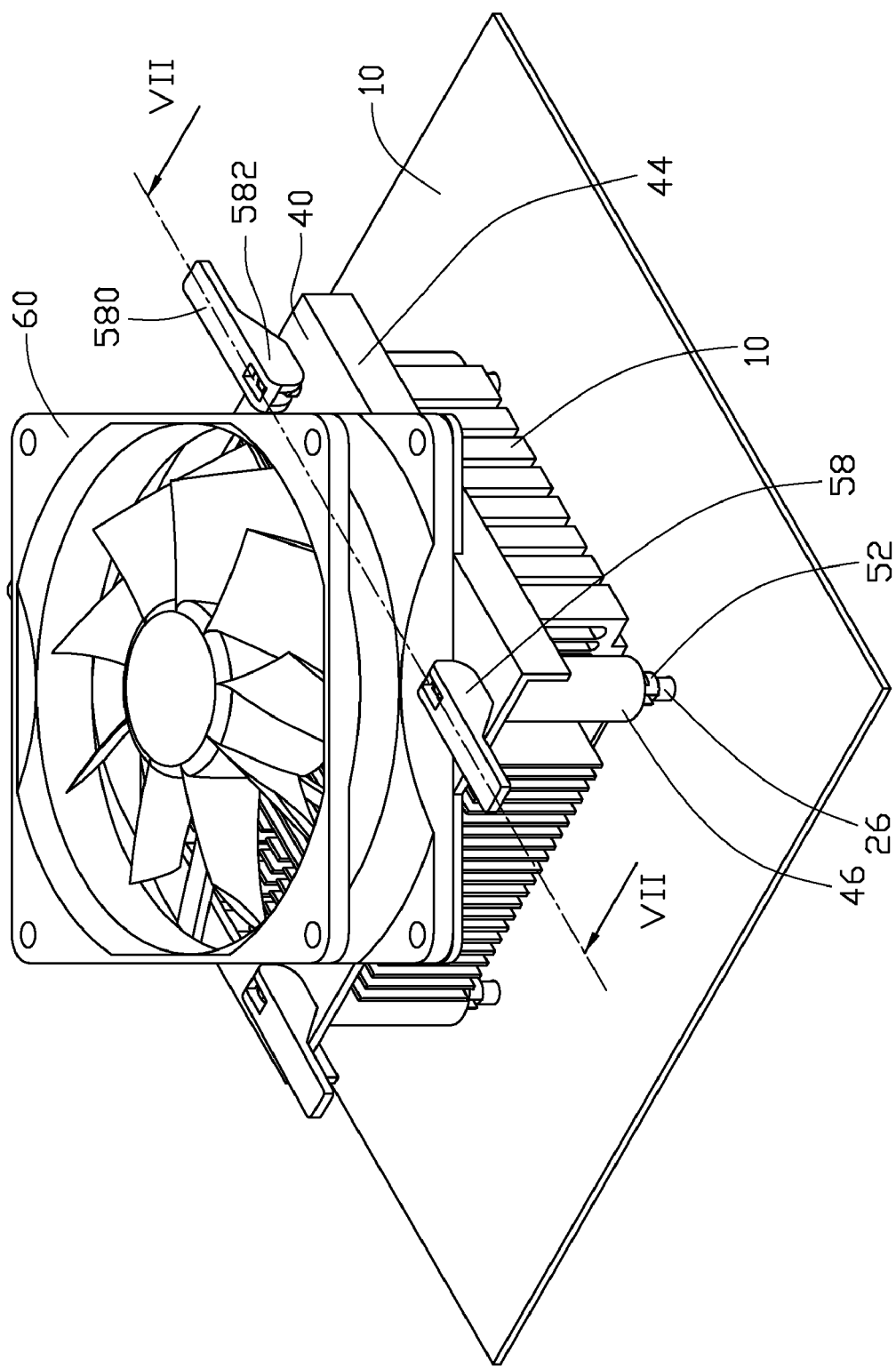
FIG. 6 is an assembled view of FIG. 1 with the clip in a closed position.
Figure 7:
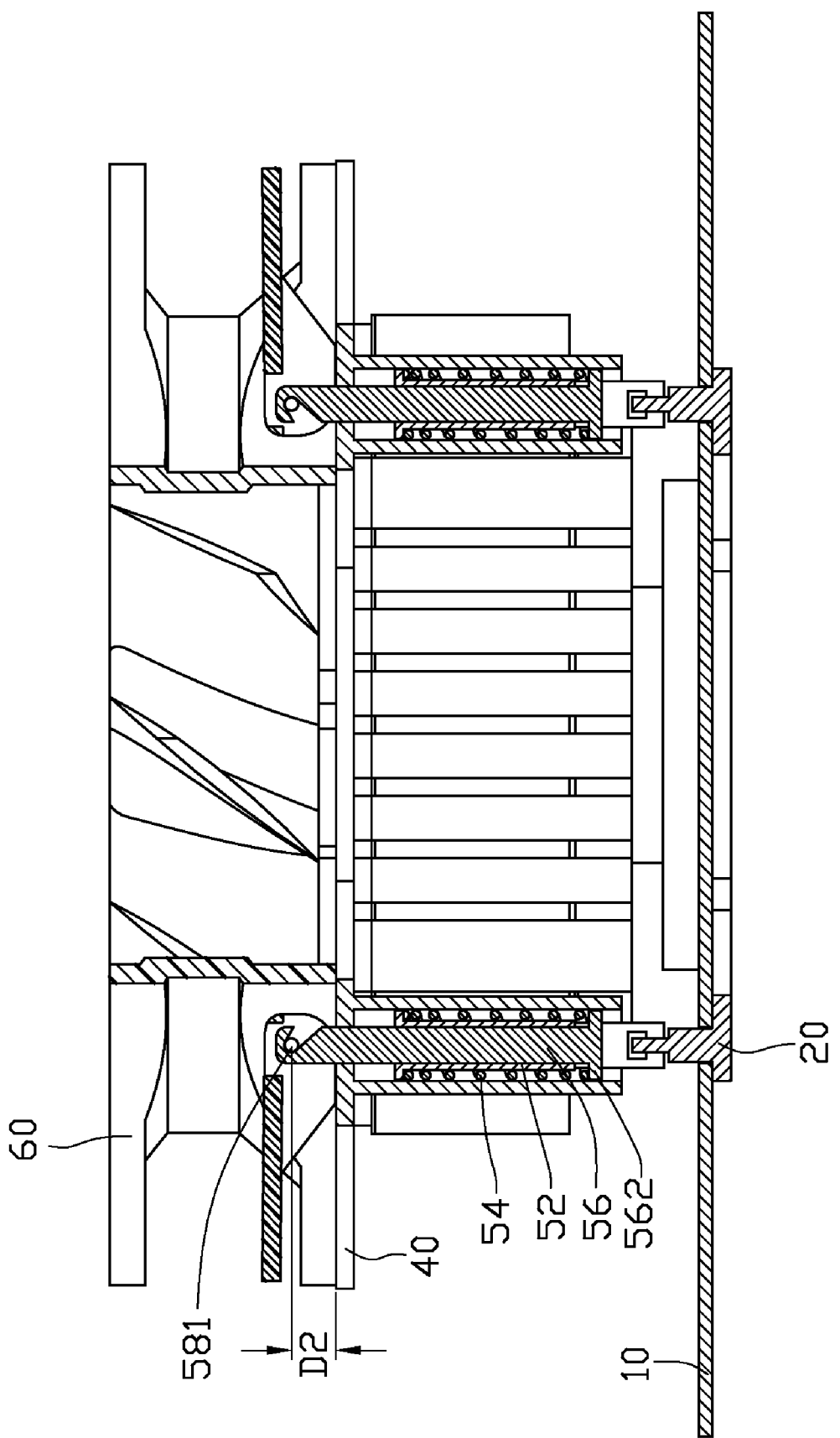
FIG. 7 is a cross-sectional view taken along line VII-VII of FIG. 6.
Figure 8:
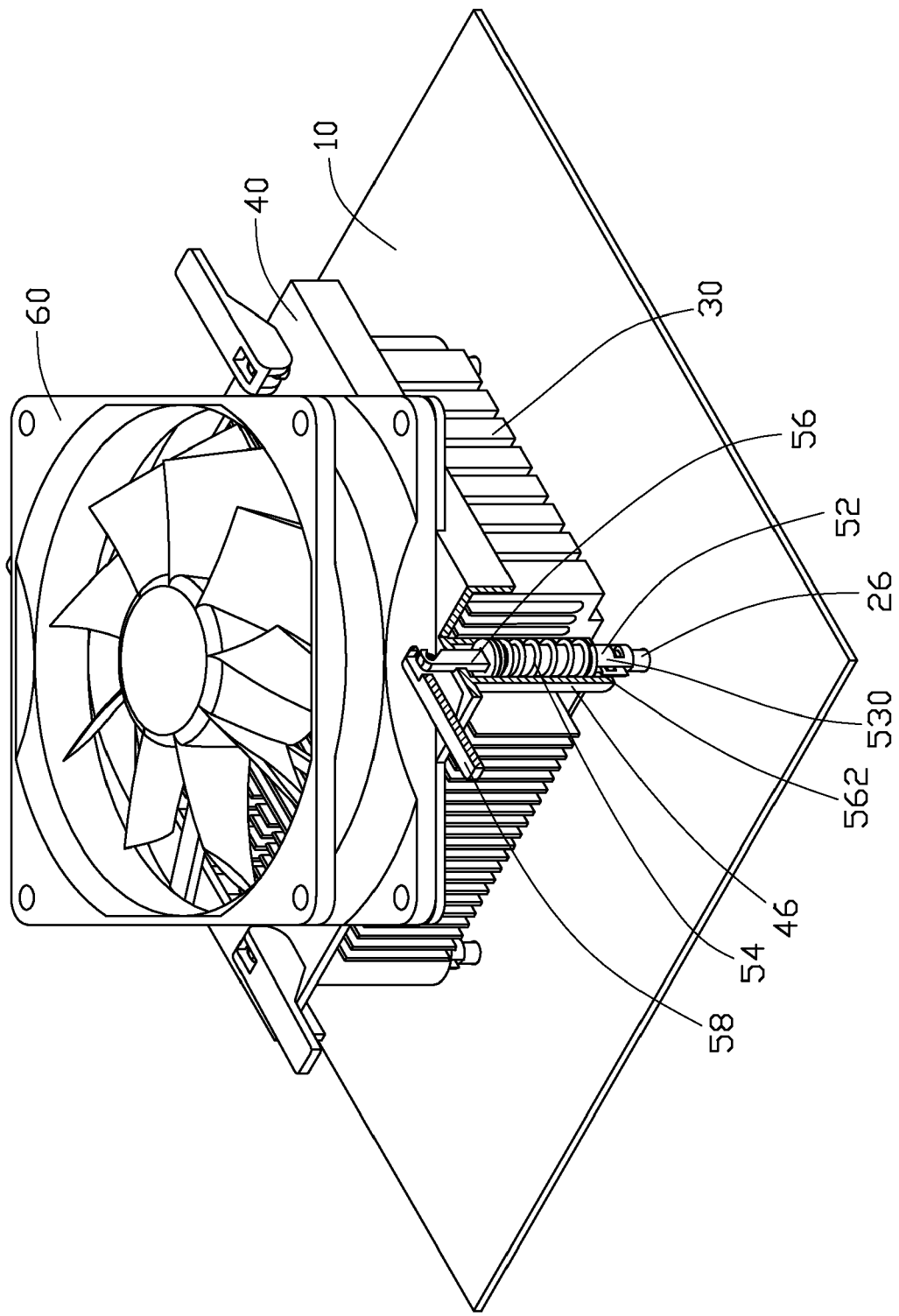
FIG. 8 is a view similar to FIG. 6, wherein the fan holder and the clip have parts being removed to clearly show an inner structure thereof.

Particularly referring to FIGS. 6-8, the handle 580 of the operating member 58 is pressed from the opened position to the closed position. In this closed position, the handle 580 is parallel to the top surface of the fan holder 40 and the retaining face 5820 of the engaging body 582 contacts with the top surface of the fan holder 40, and there is a distance D2 between the pivot 581 of the operating member 58 and the top surface of the fan holder 40. Due to the distance D2 being larger than the distance D1, the shank 56 is raised a distance relative to the sleeve 46 of the fan holder 40, wherein the distance is substantially equal to the difference between the distance D2 and D1. In this position, the bar 562 of the shank 56 abuts against the shaft 530 at a top of the channel 534 of the locking column 52; simultaneously, the locking column 52 is lifted a slight distance along the guiding portion 27 of the T-shaped stud of the back plate 20 in a manner such that the locking column 52 snappingly engages with the stop portion 28 of the back plate 20, and the spring 54 is pushed upwardly by the shank 56, whereby the spring 54 is compressed to provide an upward spring force to the locking column 52.

Thus, the heat sink 30 is securely and firmly mounted to the printed circuit board 10. Disassembly is simply the reverse of assembly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip adapted for attaching a heat sink to a board, comprising:
   a hollow locking column having a pedestal at a top thereof;
   a shank extending through the locking column;
   a spring mounted around the locking column and located between the pedestal of the locking column and a bottom of the shank; and
   an operating member mounted on the pedestal of the locking column and pivotably buckled with a top of the shank and movable between locked and unlocked position; wherein when the operating member operates from the unlocked position to the locked position, the shank moves upwardly a distance relative to the locking column and the spring provides an upwardly force to the locking column.

2. The clip as claimed in claim 1, wherein the shank comprises a catch formed on the top thereof buckled with the operating member and a bar formed on the bottom thereof, and the spring is compressed between the pedestal of the column and the bar of the shank.

3. The clip as claimed in claim 2, wherein the locking column comprises a shaft extending downwardly from the pedestal thereof, and the shaft has a vertical axis, and the operating member is capable of rotating about the axis of the shaft.

4. The clip as claimed in claim 3, wherein a slot is defined through the pedestal and the shaft of the column for providing a passage of the shank, and the shaft is bifurcated at a lower portion thereof in a manner such that a pair of spaced and symmetrical locking arms are formed, and a channel is defined between the locking arms.

5. The clip as claimed in claim 4, wherein when the operating member is positioned at the locked position, the bar of the shank abuts against the shaft at a top of the channel.

6. An electronic device assembly comprising:
   a printed circuit board having a heat-generating electronic component mounted thereon;
   a heat sink mounted on the heat-generating electronic component and comprising a base and a plurality of fins arranged on the base;
   a fan holder having a flat body mounted on a top of the heat sink and a plurality of sleeves extending downwardly from the body, each of the sleeves defining a vertical axis;
   a fan mounted on the fan holder;
   a plurality of clips corresponding to the sleeves and capable of being rotated about the vertical axes of the sleeves, each comprising a locking column received in a corresponding sleeve of the fan holder, a shank extending through the locking column, a spring mounted around the locking column and sandwiched between a top of the locking column and a bottom of the shank, and an operating member pivotably connected to the shank and located above the body of the fan holder and movable between unlocked and locked positions; and
   a back plate mounted below the printed circuit board, the back plate having a stud thereon engaging with a bottom portion of the locking column;
   wherein when the operating member of each of the clips operates from the unlocked position to the locked position, the shank of each of the clips moves upwardly a distance relative to the sleeve of the fan holder and the spring of the each of the clips is compressed to provide an upwardly force to the locking column.

7. The electronic device assembly as claimed in claim 6, wherein a plane pedestal is formed on the top of the locking column, and a bar is formed on the bottom of the shank, and the spring is sandwiched between the pedestal of the locking column and the bar of the shank.

8. The electronic device assembly as claimed in claim 7, wherein the shank comprises a catch formed on the top thereof buckled with the operating member.

9. The electronic device assembly as claimed in claim 7, wherein the locking column comprises a shaft extending downwardly from the pedestal, and a slot is defined through the pedestal and the shaft to provide a passage of the shank.

10. The electronic device assembly as claimed in claim 9, wherein the shaft is bifurcated at a lower portion thereof in a manner such that a pair of spaced and symmetrical locking arms are formed, and a channel is defined between the locking arms, and the bar of the shank abuts against the shaft at a top of the channel.

11. The electronic device assembly as claimed in claim 10, wherein an extending length of the bar is larger than an outer meter of the shaft.

12. The electronic device assembly as claimed in claim 10, wherein each of the locking arms defines a groove therein, the stud of the back plate is engaged in the groove.

13. The electronic device assembly as claimed in claim 6, wherein the operating member comprises a plane handle and a pair of spaced engaging bodies extending perpendicularly from two opposite lateral sides of the handle, and a pivot is mounted between the two engaging bodies for engaging with the top of the shank.

14. The electronic device assembly as claimed in claim 13, wherein when the operating member is positioned in the locked position, the handle is parallel to the flat body of the fan holder, while the operating member is positioned in the unlocked position, the handle is perpendicular to the flat body of the fan holder.

15. The electronic device assembly as claimed in claim 14, wherein a pair of sidewalls extend vertically and downwardly from two opposite sides of the flat body of the fan holder for engaging with two outmost fins of the heat sink, and the handle of the operating member is perpendicular to the flat body of the fan holder and rotated 90 degrees about the vertical axis of the sleeve when the stud of the back plate engages with the bottom portion of the locking column.

16. The electronic device assembly as claimed in claim 6, wherein a mounting plate extends horizontally from a central portion of each side of the flat body of the fan holder for supporting the fan mounted thereon.

\* \* \* \* \*